United States Patent
Mizutani (10) Patent No.: US 7,227,757 B2
(45) Date of Patent: Jun. 5, 2007

(54) ELECTRONIC CONTROL UNIT

(75) Inventor: Akihiro Mizutani, Nagoya (JP)

(73) Assignee: Denso Corporation, Kariya, Aichi-pref. (JP)

( * ) Notice: Subject to any disclaimer, the term of this patent is extended or adjusted under 35 U.S.C. 154(b) by 365 days.

(21) Appl. No.: 10/823,593

(22) Filed: Apr. 14, 2004

(65) Prior Publication Data

US 2005/0020141 A1    Jan. 27, 2005

(30) Foreign Application Priority Data

Apr. 14, 2003    (JP) .............................. 2003-108963

(51) Int. Cl.
*H05K 5/00*        (2006.01)
(52) U.S. Cl. ......................................... 361/752; 174/59
(58) Field of Classification Search ................. 361/752, 361/724, 753; 200/61.88; 174/59, 52.1
See application file for complete search history.

(56) References Cited

U.S. PATENT DOCUMENTS 6,407,925 B1 *   6/2002   Kobayashi et al. .........   361/752

FOREIGN PATENT DOCUMENTS

| JP | 3-2564 | 1/1991 |
|---|---|---|
| JP | 5-41076 | 6/1993 |
| JP | 2001-85858 | 3/2001 |

OTHER PUBLICATIONS

English translation of JPO Examination Report dated Jan. 30, 2007.

* cited by examiner

*Primary Examiner*—Dean A. Reichard
*Assistant Examiner*—Ivan H. Carpio
(74) *Attorney, Agent, or Firm*—Nixon & Vanderhye P.C.

(57) ABSTRACT

In an electronic control unit, a case has a peripheral side portion formed with a concave groove in which a connector is fitted with a clearance portion between the concave groove and the connector. The connector has first inclined portions connecting its lateral surface (one of its base surfaces) and its longitudinal surface (the other of its base surfaces). Each first inclined portion is inclined with respect to the lateral surface at a first angle. The concave groove comprises a base surface opposite to a lateral surface of the connector and second inclined portions opposite to first inclined portions of the connector, respectively. Each second inclined portion is inclined with respect to the base surface at a second angle. The second angle is larger than the first angle. A seal member is disposed in the clearance portion between the connector and the concave groove of the case so that the seal member seals the clearance portion therebetween.

17 Claims, 8 Drawing Sheets

ELECTRONIC CONTROL UNIT

BACKGROUND OF THE INVENTION

The present invention relates to an electronic control unit containing an electronic device and preferably applied to engine control units (ECUs) for engines.

An electronic control unit suitable for use in the ECUs has a printed circuit board where a plurality of electronic devices, such as a microcomputer, are mounted. The electronic control unit also has a case in which the printed circuit board is contained.

Figure 12:
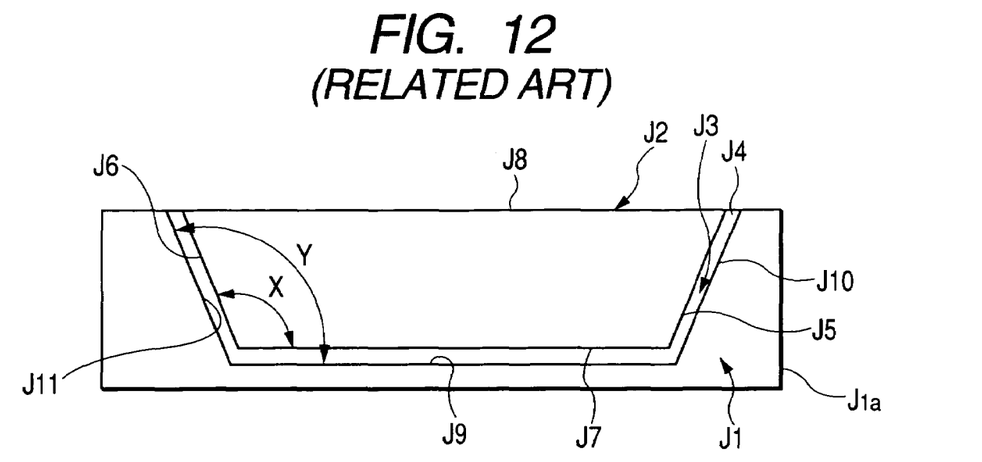
FIG. 12 is a view illustrating a conventional electronic control unit.

A conventional electronic control unit is illustrated in FIG. 12. In FIG. 12, a connector J2 is attached to one side wall J1a of a case J1 for containing the printed circuit board.

That is, the case J1 is formed at its one side wall J1a with a concave groove J3 having a substantially trapezoidal shape. The connector J2 is fixedly fitted in the concave groove J2 through a seal member J4. The seal member J4 is disposed between an outer peripheral portion of the connector J2 and an inner peripheral portion of the concave groove J3 to be closely adhered on them. This gives a waterproof connection between the connector J2 and the case J1.

The outer peripheral portion of the connector J2 includes a lateral surface J7 and a longitudinal surface J8. The longitudinal length of the longitudinal surface J8 is longer than that of the lateral surface J7. The first and longitudinal surfaces J7 and J8 are parallel to each other.

The outer peripheral portion also includes an inclined side surface J5 connecting one end of the lateral surface J7 and one end of the longitudinal surface J8, and an inclined side surface J6 connecting the other end of the lateral surface J7 and other end of the longitudinal surface J8. The inclined side surfaces J5 and J6 are not paralleled to each other.

The inner peripheral portion of the concave groove J3 includes a base surface J9 opposed to the lateral surface J7. The inner peripheral portion of the concave groove J3 also includes an inclined side surface J10 connected at its one end portion to one end of the base surface J9 and opposite to the inclined side surface J5. The inner peripheral portion of the concave groove J3 also has an inclined side surface J11 connected at its one end portion to the other end of the base surface J9 and opposite to the inclined side surface J6.

The connector inclined angle X between the lateral surface J7 and the inclined side surface J5 and that between the lateral surface J7 and the inclined side surface J6 are equal to each other. Similarly, the case inclined angle Y between the bottom surface J9 and the inclined side surface J10 and that between the bottom surface J9 and the inclined side surface J11 are equal to each other. In addition, the connector inclined angle X and the case inclined angle Y are also equal to each other.

Figure 13:
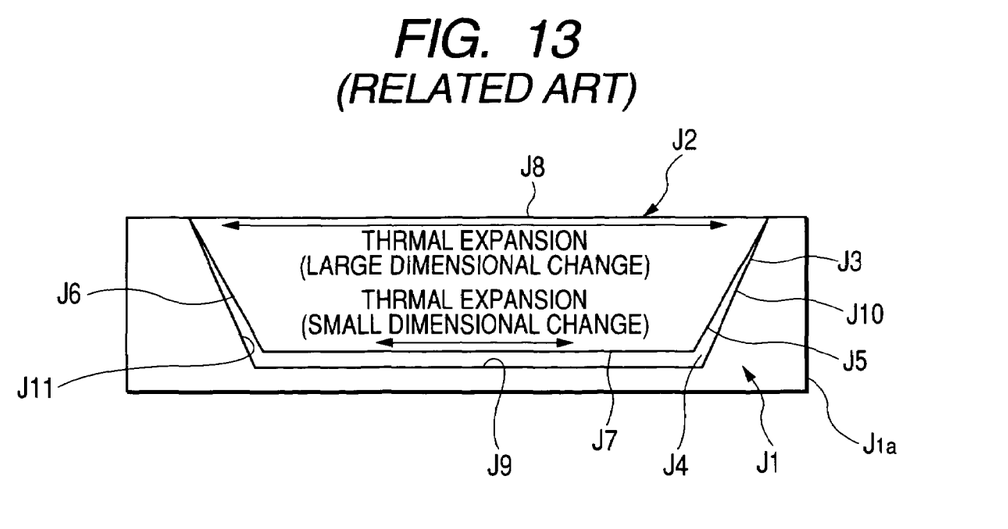
FIG. 13 is a front view of the electronic control unit shown in FIG. 12 in a state that a connector thermally expands.

In the structure of the electronic control unit, if the connector J2 thermally expands, as shown in FIG. 13, the dimensional change of the longitudinal surface J8 is larger than that of the lateral surface J7. This causes the seal member J4 in part of its longitudinal surface J8 side to be highly compressed so that a crack may occur in the seal member J4.

If the crack occurs in the seal member J4 between the connector J2 and the case J1, it might be difficult to maintain the airtightness environment of the electronic control unit.

This problem may become much more prominent when the connector J2 is made of a material with a first linear expansion coefficient and the case J1 is made of another material with a second linear expansion coefficient that is different from the first liner expansion coefficient.

Figure 14A:
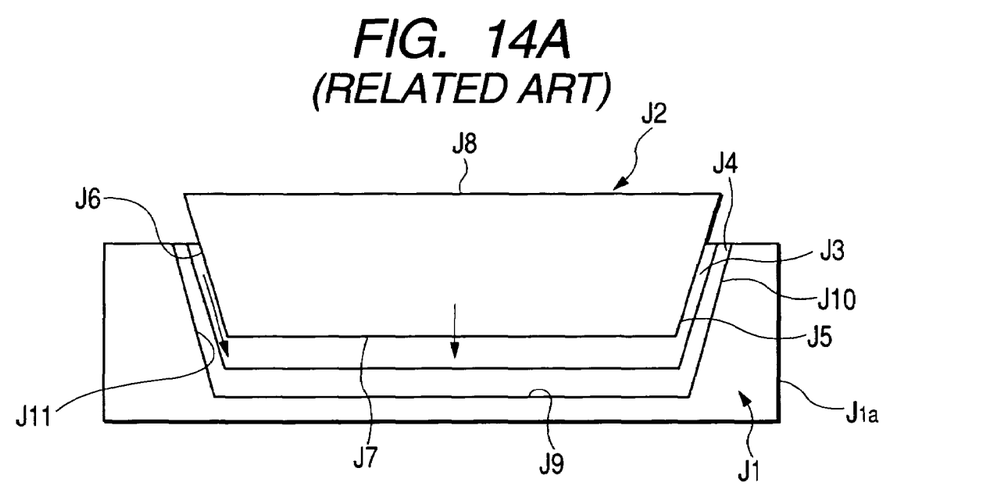
FIG. 14A is a front view of the electronic control unit shown in FIG. 12 in a state that the connector is inserted into a concave groove of the case.

In addition, if the case inclined angles are shapely inclined, when fitting the connector J2 into the inner peripheral portion of the concave groove J3, on which the seal member J4 is previously adhered, the connector J2 may press the seal member J4 in part of its longitudinal surface J8 side into the base surface J9 side of the case J1 (low side in FIG. 14A).

Figure 14B:
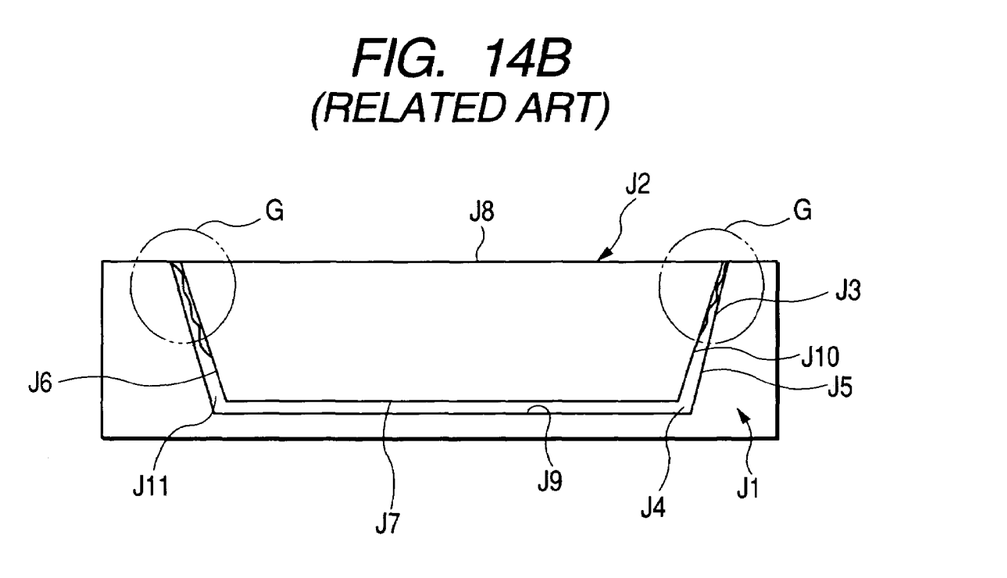
FIG. 14B is a front view of the electronic control unit shown in FIG. 12 in a state that the connector is completely fitted in the concave groove of the case.

If the part of seal member J4 in its longitudinal surface J8 side is pressed into the base surface J9 side of the case J1, the fill quantity of the seal member J4 may be insufficient at the gaps G between the longitudinal side portion of the connector J2 and each other end portion of each of the inclined side surfaces J10 and J11 (see FIG. 14B).

The full quantity of seam member J4 may be inadequate in maintaining the airtightness of the electronic control unit between the connector J2 and the case J1.

SUMMARY OF THE INVENTION

The present invention is made on the background.

Accordingly, it is an object of the present invention to provide an electronic control unit capable of sufficiently maintaining the airtightness thereof.

According to one aspect of the present invention, there is provided an electronic control unit. The electronic control unit comprises a connector having a lateral surface, a longitudinal surface opposite to the lateral surface, and a pair of first inclined portions connecting the lateral surface and the longitudinal surface. At least one of the first inclined portions is inclined with respect to the lateral surface at a first angle. The electronic control unit also comprises a case having a peripheral side portion formed with a concave groove in which the connector is fitted with a clearance portion therebetween. The concave groove comprises a base surface opposite to the lateral surface of the connector and a pair of second inclined portions opposite to the first inclined portions, respectively. At least one of the second inclined portions opposite to the at least one of said first inclined portions is inclined with respect to the base surface at a second angle. The second angle is larger than the first angle. The electronic control unit comprises a seal member disposed in the clearance portion between the connector and the concave groove of the case so that the seal member seals the clearance portion therebetween.

According to another aspect of the present invention, there is provided an electronic control unit. The electronic control unit comprises a connector having a lateral surface, a longitudinal surface opposite to the lateral surface, and a pair of first inclined portions connecting the lateral surface and the longitudinal surface. The electronic control unit also comprises a case having a peripheral side portion formed with a concave groove in which the connector is fitted with a clearance portion therebetween. The concave groove comprises a base surface opposite to the lateral surface of the connector; and a pair of second inclined portions opposite to the first inclined portions, respectively. The electronic control unit comprises a seal member disposed in the clearance portion between the connector and the concave groove of the case so that the seal member seals the clearance portion therebetween. A first clearance is formed between each first inclined portion of the connector and each second inclined portion of the case and positioned parallely in adjacent to the longitudinal surface of the connector. A second clearance is formed between each first inclined portion of the connector and each second inclined portion of the case and positioned parallely in adjacent to the lateral surface of the connector. The first clearance is wider than the second clearance.

According to further aspect of the present invention, there is provided an electronic control unit. The electronic control unit comprises a connector having a lateral surface, a longitudinal surface opposite to the lateral surface, and a pair of first inclined portions connecting the lateral surface and the longitudinal surface. The electronic control unit also comprises a case having a peripheral side portion formed with a concave groove in which the connector is fitted with a clearance portion therebetween. The concave groove comprises a base surface opposite to the lateral surface of the connector; and a pair of second inclined portions opposite to the first inclined portions, respectively. At least one of the inclined portions is formed with at least partially a plurality of stepped portions over an inclination direction of the at least one of the inclined portions. The control unit further comprises a seal member disposed in the clearance portion between the connector and the concave groove of the case so that the seal member seals the clearance portion therebetween.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the invention will be described hereinafter with reference to the accompanying drawings.

(First Embodiment)

Figure 1:
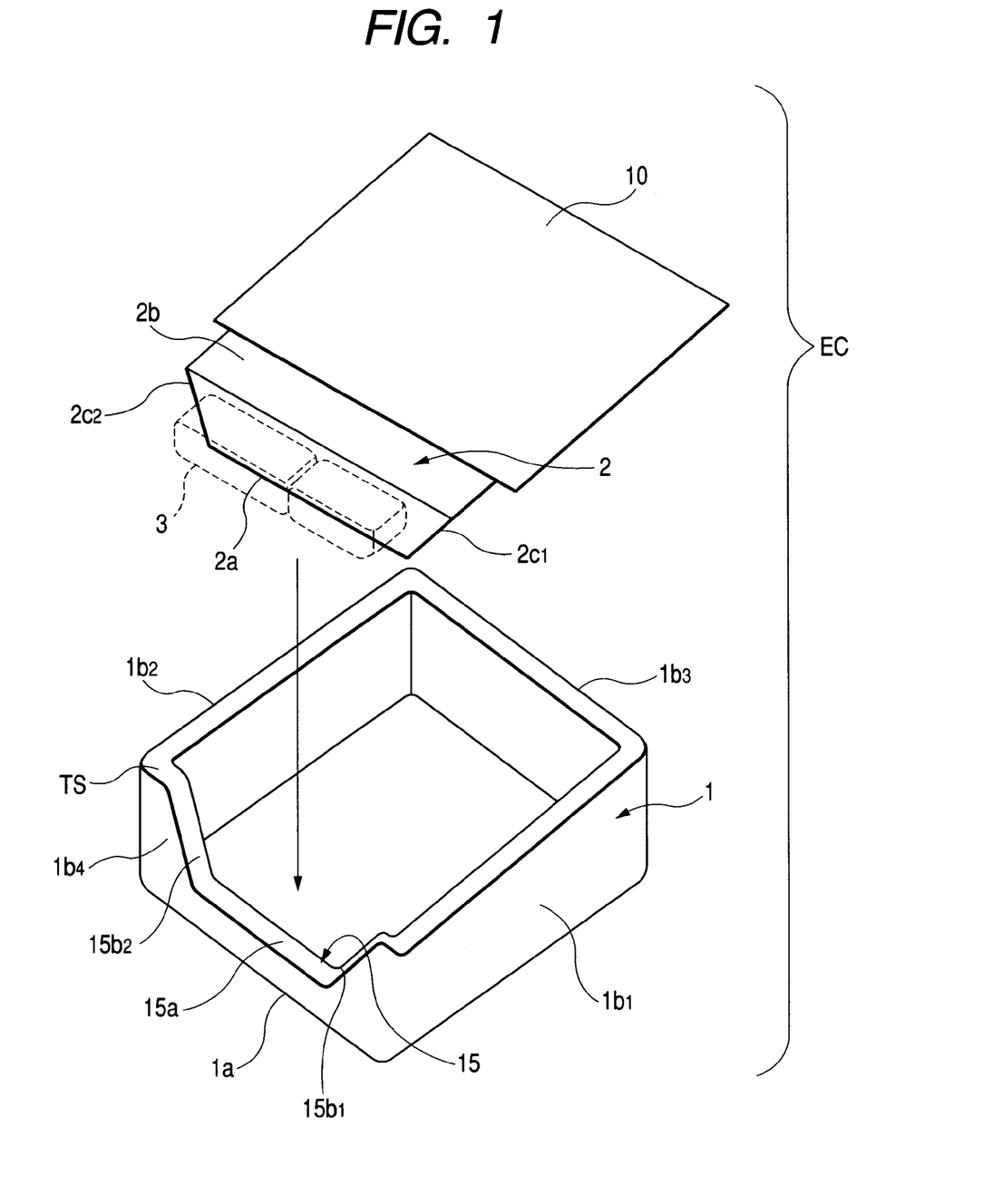
FIG. 1 is an exploded perspective view of an electronic control unit according to a first embodiment of the present invention, which illustrates a state that a connector of the electronic control unit is attached to a case thereof.
Figure 2:
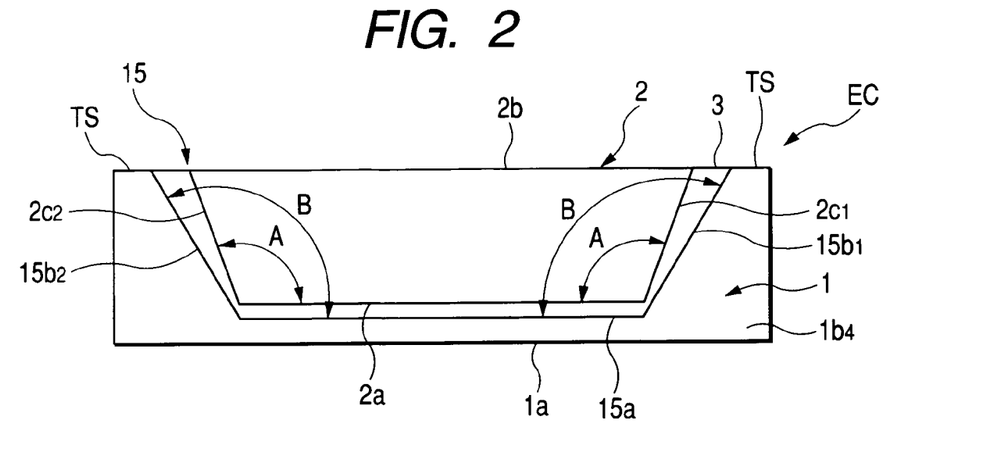
FIG. 2 is a front view of the electronic control unit shown in FIG. 1 in a state that the connector is completely attached to the case.

FIG. 1 is an exploded perspective view of an electronic control unit EC according to a first embodiment of the present invention, which illustrates a state that a connector 2 of the electronic control unit EC is attached to a case 1 thereof. FIG. 2 is a front view of the electronic control unit EC in a state that the connector 2 is completely attached to the case 1.

The electronic control unit EC according to the first embodiment is applied to an ECU for engines.

As shown in FIGS. 1 and 2, the case 1 has, for example, a substantially rectangular parallelepiped shape and is made of a material having a first linear expansion coefficient, for example, metal such as aluminum or resin.

The case 1 has a rectangular bottom wall 1a and a top opened surface opposite thereto. The case 1 also has a pair of longitudinal side walls 1b1 and 1b2 extending upwardly from the two longitudinal sides of the bottom wall 1a, respectively. The case 1 further has a pair of lateral side walls 1b3 and 1b4 extending upwardly from the two lateral sides of the bottom wall 1a, respectively.

One of the side walls 1b1–1b4, such as the lateral side wall 1b4 is formed with a concave groove 15 having a substantially inverted isosceles trapezoidal shape.

That is, the concave groove 15 has an inner peripheral portion that is composed of a rectangular bottom surface (lateral base surface) 15a parallel to the bottom wall 1a of the case 1, and a pair of rectangular inclined surfaces 15b1 and 15b2 which are not parallel but have equal longitudinal lengths.

One longitudinal end portion of one inclined surface 15b1 is connected to one lateral side of the bottom surface 15a, and one longitudinal end portion of the other inclined surface 15b2 is connected to the other lateral side of the bottom surface 15a.

Each of the inclined surfaces 15b1 and 15b2 is inclined outwardly with respect to the bottom surface 15a at an angle B within the range from approximately 96° to approximately 131°. The angle B is referred to as "case inclined angle" hereinafter. Other longitudinal end portions of the inclined surfaces 15b1 and 15b2 of the concave groove 15 are connected to the top peripheral surface TS of the case 1.

The connector 2 is made of, for example a material with another material against the case 1, which has a second linear expansion coefficient different from the first liner expansion coefficient. In particular, the second linear expansion coefficient is larger than the first linear expansion coefficient.

The connector 2 has a substantially isosceles trapezoidal shape that substantially corresponds to the shape of the concave groove 15 of the case 1.

That is, the connector 2 is composed of a lateral surface (lateral base surface) 2a corresponding to one base of the isosceles trapezoidal shape, and a longitudinal surface (longitudinal base surface) 2b opposed thereto and corresponding to the other base thereof.

The lateral surface 2a is defined in that its area is smaller than that of the longitudinal surface 2b. In particular, in a case where each of the lateral surface and longitudinal surface has a substantially rectangular shape, the longitudinal length of the lateral surface 2a is shorter than that of the longitudinal surface 2b. The lateral and longitudinal surfaces 2a and 2b are parallel to each other.

The connector 2 also has a pair of inclined surfaces 2c1 and 2c2 connecting both lateral sides of the lateral surface 2a to both lateral sides of the longitudinal surfaces 2b, respectively.

As shown in FIGS. 1 and 2, a printed circuit board 10 as an electronic circuit unit, where a plurality of electronic devices such as a microcomputer are mounted is mechanically and electrically connected to the longitudinal surface 2b of the connector 2 to be parallel thereto.

The connector 2 is inserted from its lateral surface 2a side into the concave groove 15 so that the connector 2 is fixedly fitted therein through a seal member 3 disposed between the connector 2 and the concave groove 15. That is, the connector 2 is fitted in the concave groove 15 with a clearance portion therebetween. The seal member 3 is filled in the clearance portion, whereby the connector 2 and the concave groove 15 are fixed and sealed.

The longitudinal surface 2b is located at the opened longitudinal base of the concave groove 15 so that the longitudinal surface 2b is substantially parallel to the top peripheral surface TS of the case 1. The inclined surfaces 2c1 and 2c2 of the connector 2 are opposite to the inclined surfaces 15b1 and 15b2 of the concave groove 15 through the seal member 3, respectively.

Each of the inclined surfaces 2c1 and 2c2 of the connector 2 is inclined outwardly with respect to the lateral surface 2a thereof at an angle A within the range from approximately 95° to approximately 130° so that the angle A is smaller than the case inclined angle B of each of the inclined surfaces 15b1 and 15b2 of the case 1. The angle A is referred to as "connector inclined angle" hereinafter.

In this first embodiment, the difference between the case inclined angle B and the connector inclined angle A is set equal to 1° (degree) or more.

This difference between the case inclined angle B and the connector inclined angle A allows, at ambient temperature, the clearance portion in part of its longitudinal surface 2b side of the connector 2 to be wider than that in part of its lateral surface 2a side thereof.

In addition, the seal member 3 is made of, for example, a liquid material such as silicon or an elastic material. The seal member 3 is filled between the connector 2 and the case 1 to be closely adhered on the surfaces 2a, 2c1 and 2c2 of the connector 2 and surfaces 15a, 15c1 and 15c2 of the concave groove 15, which allows the connection between the case 1 and the connector 2 to be waterproof.

It is noted that, in this first embodiment, the compressibility of the part of the seal member 3 that is adjacent to the longitudinal surface 2b in the longitudinal direction is referred to as "CM2". Similarly, the compressibility of the part of the seal member 3 that is adjacent to the lateral surface 2a in the longitudinal direction is referred to as "CM1".

In the electronic control unit EC, the compressibility CM2 is set to be equal to or less than the compressibility CM1.

Figure 3:
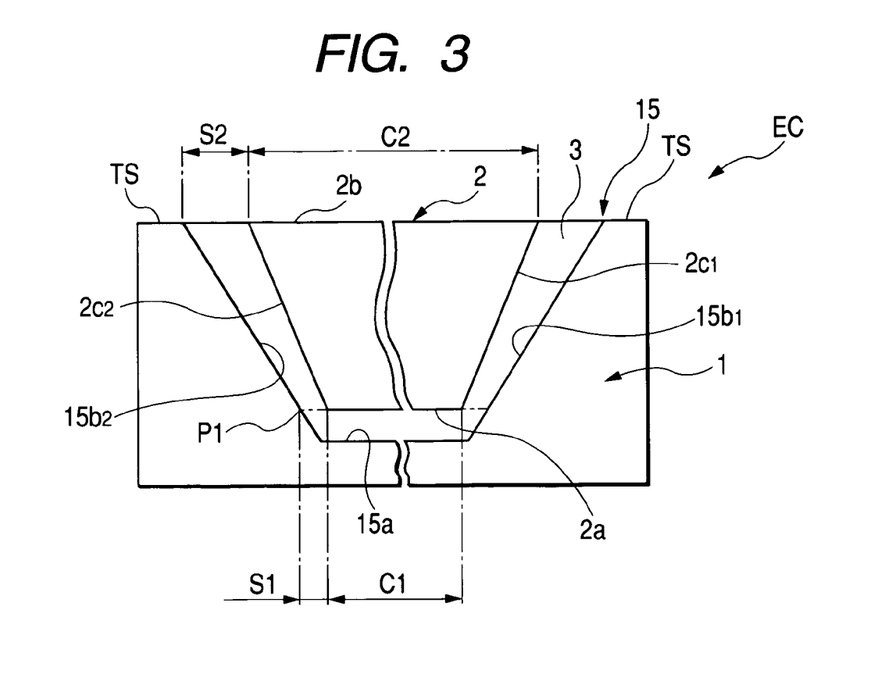
FIG. 3 is an enlarged view of the electronic control unit shown in FIG. 2

Then, in order to concretely represent the compressibility CM1 and the compressibility CM2, the second linear expansion coefficient is represented as $\alpha$, and the operating temperature of the electronic control unit CE (the temperature of connector 2), is represented as T. In addition, as shown in FIG. 3, the longitudinal length of the lateral surface 2a of the connector 2 is represented as C1, and the longitudinal length of the longitudinal surface 2b thereof is represented as C2.

Moreover, the clearance of the clearance portion formed between the one lateral side of the inclined surface 2c2 (2c1) of the connector 2 and the portion P1 of the lateral surface 15a side of the inclined surface 15b2 (15b1) which is an extension of the lateral surface 2a is represented as S1.

Furthermore, the clearance of the clearance portion formed between the longitudinal surface 2b side end of the inclined surface 2c2 (2c1) of the connector 2 and the other longitudinal end portion of the inclined surface 15b2 (15b1) along the longitudinal surface direction is represented as S2. The clearance S2 is wider than the clearance S1.

Based on the above representations, the compressibility CM1 is represented as the following equation:

$$CM1 = ((\alpha T \cdot C1 - C1)/2)/S1$$

In addition, the compressibility CM2 is represented as the following equation:

$$CM2 = ((\alpha T \cdot C2 - C2)/2)/S2$$

In this first embodiment, these values of $\alpha$, T, C1, C2, S1, and S2 are set so that the compressibility CM1 is equal to or larger than the compressibility CM2. That is, these values are set to satisfy the following equation:

$$((\alpha T \cdot C1 - C1)/2)/S1 \geq ((\alpha T \cdot C2 - C2)/2)/S2$$

When assembling the electronic control unit EC, the seal member 3 is applied on at least one of the case 1 and connector 2. That is, the seal member 3 is applied on either the surface portion (surfaces 2a, 2c1 and 2c2) of the connector 2 or the surface portion (surfaces 15a, 15b1 and 15b2) of the concave groove 15 of the case 15.

Figure 4A:
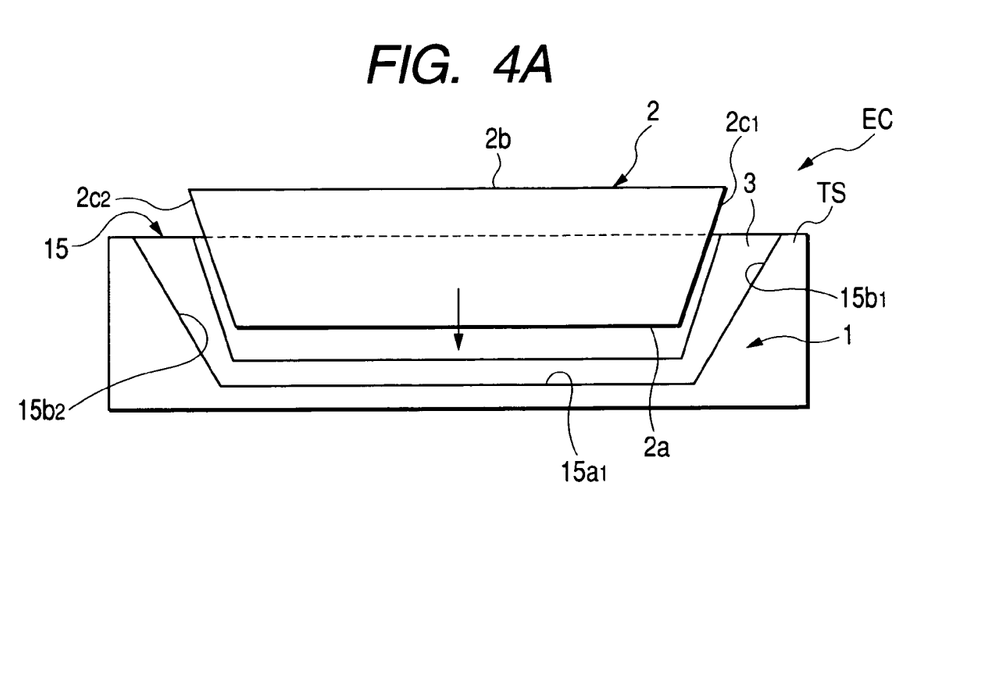
FIG. 4A is a front view of the electronic control unit according to the first embodiment in a state that the connector is inserted into a concave groove of the case according to the first embodiment of the present invention.

After the seal member applying process, as shown in FIGS. 1 and 4A, the connector 2 is inserted to be fitted in the concave groove 15 of the case 1 through the seal member 3. When the connector 2 is fitted in the concave groove 15, the surfaces 2a, 2c1 and 2c2 of the connector 2 are closely adhered on the seal member 3, and the surfaces 15a, 15b1 and 15b2 of the concave groove 15 are also closely adhered on the seal member 3 (see FIG. 4B).

Incidentally, the inventors of the present invention actually prepared the case 1 and the connector 2 which are made of polybutylene terphthalate (PBT) so that each inclined angle A of each inclined surface 2c1, 2c2 of the connector 2 is set to approximately 95°, and each inclined angle B of each inclined surface 15b1, 15b2 of the concave groove 15 is set to approximately 107°. The inventors used the prepared case 1 and the connector 2 to actually assemble the electronic control unit EC in accordance with the above assembling process.

That is, when inserting the connector 2 in the concave groove 15 of the case 1 to fit it therein, the seal member 3 is pressed by the lateral surface 2a and the inclined surfaces 2c1 and 2c2 of the connector 2.

Figure 4B:
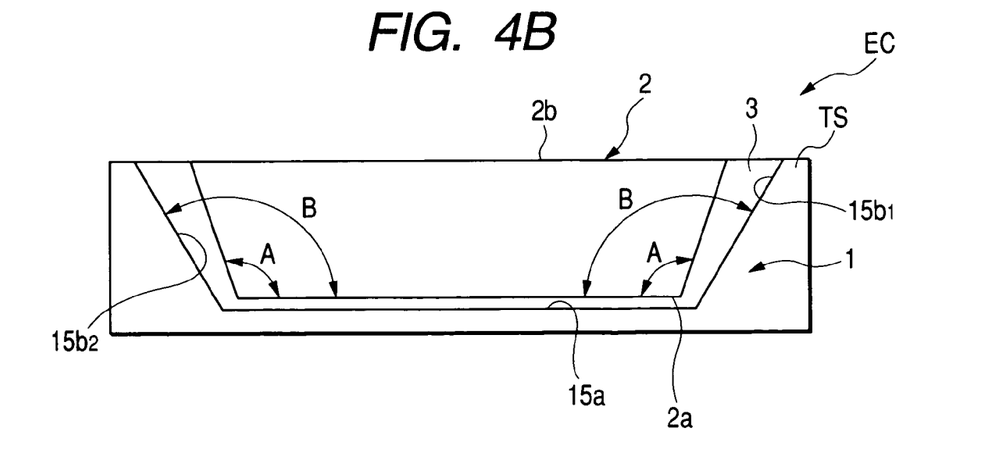
FIG. 4B is a front view of the electronic control unit according to the first embodiment in a state that the connector is already fitted in the concave groove of the case through a seal member according to the first embodiment of the present invention.

According to the electronic control unit EC, however, the inclined angle A of each inclined surface 2c1, 2c2 of the connector 2 is smaller than the inclined angle B of each inclined surface 15b1, 15b2 of the concave groove 15 (see FIG. 4B). This structure allows the amount of the seal member 3 that is pressed toward the lateral surface 15a side of the concave groove 15 to decrease. The fill quantity of the seal member 3 adjacent to the longitudinal surface 2b of the connector 2 can be sufficiently kept, making it possible to sufficiently maintain the airtightness of the electronic control unit EC between the connector 2 and the case 1.

In addition, in this first embodiment, the connector inclined angle A of each inclined surface 2c1, 2c2 of the connector 2 is set to be smaller than the case inclined angle B of each inclined surface 15b1, 15b2 of the case 1. This relationship between the connector inclined angle A and the case inclined angle B allows the thickness of the seal member 3 in part of its longitudinal surface 2b side in the longitudinal direction to be larger than that of the seal member 3 in part of its lateral surface 2a side in the longitudinal direction.

The increase of the thickness of the seal member 3 in part of its longitudinal surface 2b side allows, even if the longitudinal surface 2b side of the connector 2 thermally expands, the stress caused by the connector's thermal expansion to be absorbed by the thickness of the seal member 3 in part of its longitudinal surface 2b side.

In addition, according to the first embodiment, the clearance S2 is formed between the longitudinal surface 2b side end of each inclined surface 2c1, 2c2 of the connector 2 and the other lateral end portion of each inclined surface 15b1, 15b2 of the case 1 and is positioned parallely in adjacent to the longitudinal surface 2b. The clearance S1 is formed between the lateral surface 2a side end of the inclined surface 2c1, 2c2 of the connector 2 and the lateral surface 15a side of the inclined surface 15b1, 15b2 of the case 1 and is positioned parallely in adjacent to the lateral surface 2a.

Figure 5:
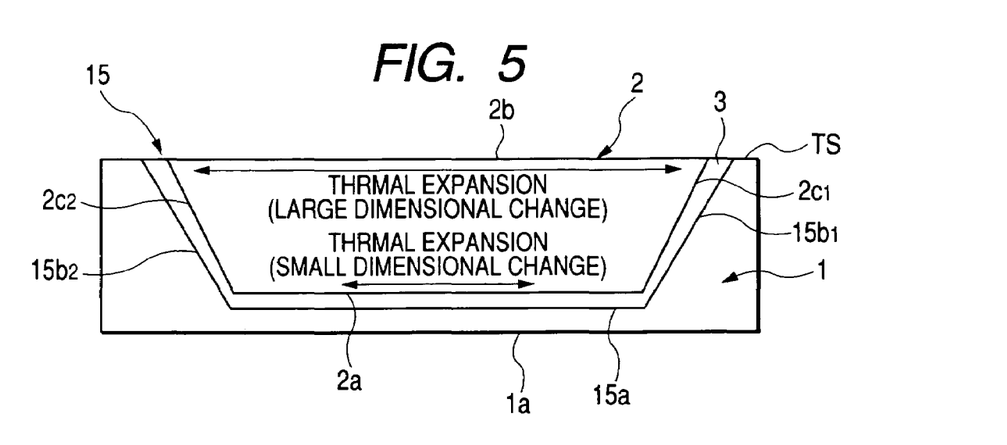
FIG. 5 is a front view of the electronic control unit shown in FIG. 1 in a state that the connector thermally expands according to the first embodiment of the present invention.

Because the clearance S2 is wider than the clearance S1, even if the connector 2 thermally expands, as shown in FIG. 5, this structure prevents the excessive increase of the compressibility of the case 1 in part of its longitudinal surface 2b side. Consequently, it is possible to prevent cracks from occurring in the longitudinal surface 2b side of the seal member 3.

Moreover, in the first embodiment, in a case where the connector 2 thermally expands, the compressibility CM2 of the seal member 3 in part of its longitudinal surface 2b side is set to be equal to or less than the compressibility CM1 of the seal member 3 in part of its lateral surface side 2a.

This structure prevents the compressibility CM2 from increasing as compared with the compressibility CM1, thereby further effectively preventing cracks from occurring in the longitudinal surface 2b side of the seal member 3.

Incidentally, the difference between the connector inclined angle A and the case inclined angle B may be variable according to the usable environment of the electronic control unit EC, the specifications thereof, and the like on the grounds that the material of the case 1, the dimension of the height (lateral length of each side wall) of the case 1, the material of the seal member 4, and other factors on which the difference between the inclined angles A and B depends, as long as the fill quantity of the seal member 3 adjacent to the longitudinal surface 2b of the connector 2 can be sufficiently kept, making it possible to sufficiently maintain the airtightness of the electronic control unit EC between the connector 2 and the case 1.

(Second Embodiment)

Figure 6:
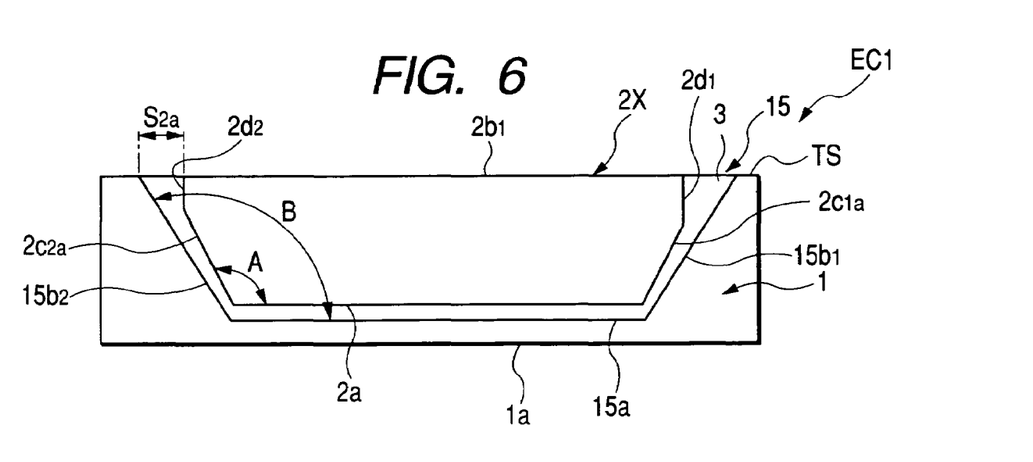
FIG. 6 is a front view of an electronic control unit to which the connector is attached according to a second embodiment of the present invention.

FIG. 6 is a front view of an electronic control unit EC1 according to a second embodiment of the present invention. In this second embodiment, the electronic control unit EC1 has a connector 2X whose shape is different from the connector 2 according to the first embodiment.

Other elements of the electronic control unit EC1 are substantially identical with those of the electronic control unit EC according to the first embodiment so that they are assigned to the same reference characteristics of the electronic control unit EC shown in FIG. 1, and explanations thereabout are omitted.

In this second embodiment, the connector 2X has chamfered portions 2d1 and 2d2 that are formed by chamfering both of the corner portions formed between both of the other lateral ends of the inclined surfaces 2c1, 2c2 and both lateral ends of the longitudinal surface 2b of the connector 2 shown in FIG. 2.

That is, the chamfered portions 2d1 and 2d2 extend substantially orthogonally from both lateral ends of a longitudinal surface 2b1 toward inclined surfaces 2c1a and 2c2a of the connector 2 to be connected to both other ends of the inclined surfaces 2c1a and 2c2a.

The chamfered portions 2d1 and 2d2 make short the length of the longitudinal surface 2b1 in the longitudinal direction as compared with the length of the longitudinal surface 2b.

This structure makes wide the clearance S2a between the longitudinal surface 2b1 side end of each chamfered portion 2d1, 2d2 of the connector 2X and the other lateral end portion of each inclined surface 15b1, 15b2 of the case 1, as compared with the clearance S2 according to the first embodiment.

The wide of the clearance S2a allows the thickness of the seal member 3 at its longitudinal surface 2b1 side in the longitudinal direction to be larger than that of the seal member 3 according to the first embodiment.

As a result, it is possible for the thickness of the seal member 3 at its longitudinal surface 2b1 side to absorb the stress caused by the connector's thermal expansion more effectively, as compared with the absorption of the first embodiment. This makes it possible to prevent cracks from occurring in the longitudinal surface 2b side of the seal member 3.

(Third Embodiment)

Figure 7:
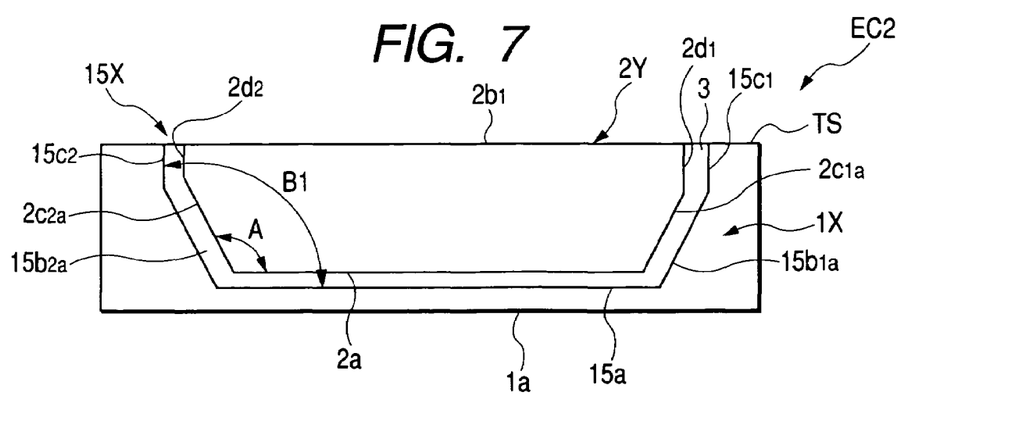
FIG. 7 is a front view of an electronic control unit to which the connector is attached according to a third embodiment of the present invention.

FIG. 7 is a front view of an electronic control unit EC2 according to a third embodiment of the present invention. In this third embodiment, the electronic control unit EC2 has a case 1X whose shape is different from the case 1 according to the first embodiment.

Other elements of the electronic control unit EC2 are substantially identical with those of the electronic control unit EC1 according to the second embodiment so that they are assigned to the same reference characteristics of the electronic control unit EC1 shown in FIG. 6, and explanations thereabout are omitted.

In this third embodiment, similar to the first and second embodiments, the case 1X has the bottom wall 1a, and the side walls 1b1–1b4, and the side wall 1b4 is formed with a concave groove 15X having a substantially inverted isosceles trapezoidal shape.

The concave groove 15X is composed of the lateral surface 15a, and a pair of rectangular inclined surfaces 15b1a and 15b2a that are not parallel but have equal longitudinal lengths.

One longitudinal end portion of one inclined surface 15b1a is connected to one lateral side of the lateral surface 15a, and one longitudinal end portion of other inclined surface 15b2a is connected to other lateral side of the lateral surface 15a.

Each of the inclined surfaces 15b1a and 15b2a is inclined outwardly with respect to the bottom surface 15a to be substantially parallel to each of the inclined surfaces 2c1a and 2c2a.

Other longitudinal end portions 15c1 and 15c2 of the inclined surfaces 15b1 and 15b2 of the concave groove 15, which are opposite to the chamfered portions 2d1 and 2d2 of the connector 2X, extend to be parallel to the chamfered portions 2d1 and 2d2, respectively, and connected to the top surface TS of the case 1X.

That is, in the third embodiment, the other longitudinal end portions 15c1 and 15c2 of the inclined surfaces 15b1 and 15b2 of the concave groove 15 are substantially orthogonal to the top surface TS of the case 1X.

In the third embodiment, each of other end portions 15c1 and 15c2 of the inclined surfaces 15b1a and 15b2a is inclined outwardly with respect to the bottom surface 15a at a case inclined angle B1, and the connector inclined angle A is smaller than the case inclined angle B1.

This structure makes it possible to obtain the above described effects related to the relationship between the connector inclined angle A and the case inclined angle B1 according to the first embodiment.

Incidentally, in the third embodiment, other end portions 15c1 and 15c2 of the inclined surfaces 15b1a and 15b2a are substantially parallel to the chamfered portions 2d1 and 2d2 and substantially orthogonal to the top surface TS of the case 1X, but the present invention is not limited to the structure.

Figure 8:
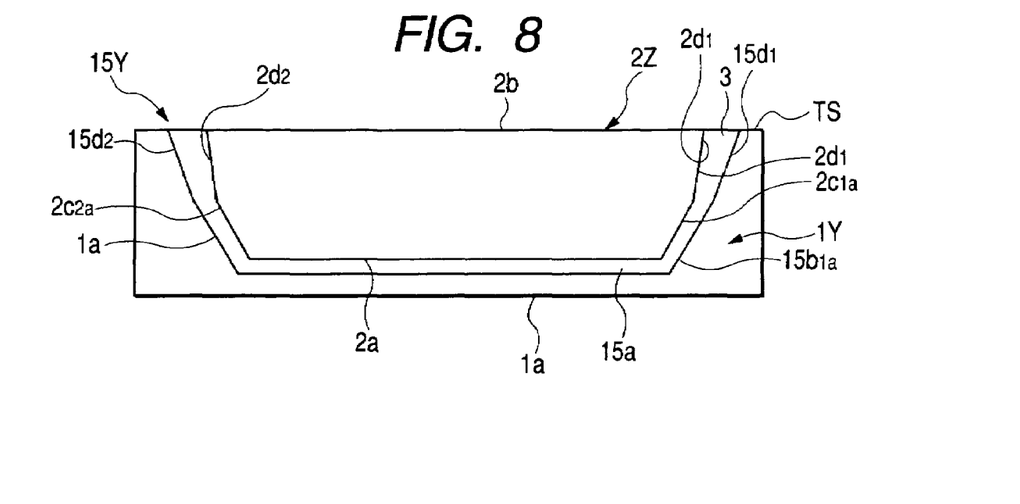
FIG. 8 is a front view of an electronic control unit to which the connector is attached according to a modification of the third embodiment of the present invention.

That is, as shown in FIG. 8, other longitudinal end portions 15d1 and 15d2 of the inclined surfaces 15b1 and 15b2 of the concave groove 15Y of the case 1Y may extend not to be parallel to the chamfered portions 2d1 and 2d2, respectively. The other longitudinal end portions 15d1 and 15d2 of the inclined surfaces 15b1 and 15b2 of the concave groove 15 may be non-orthogonally connected to the top surface TS of the case 1Y.

(Fourth Embodiment)

Figure 9:
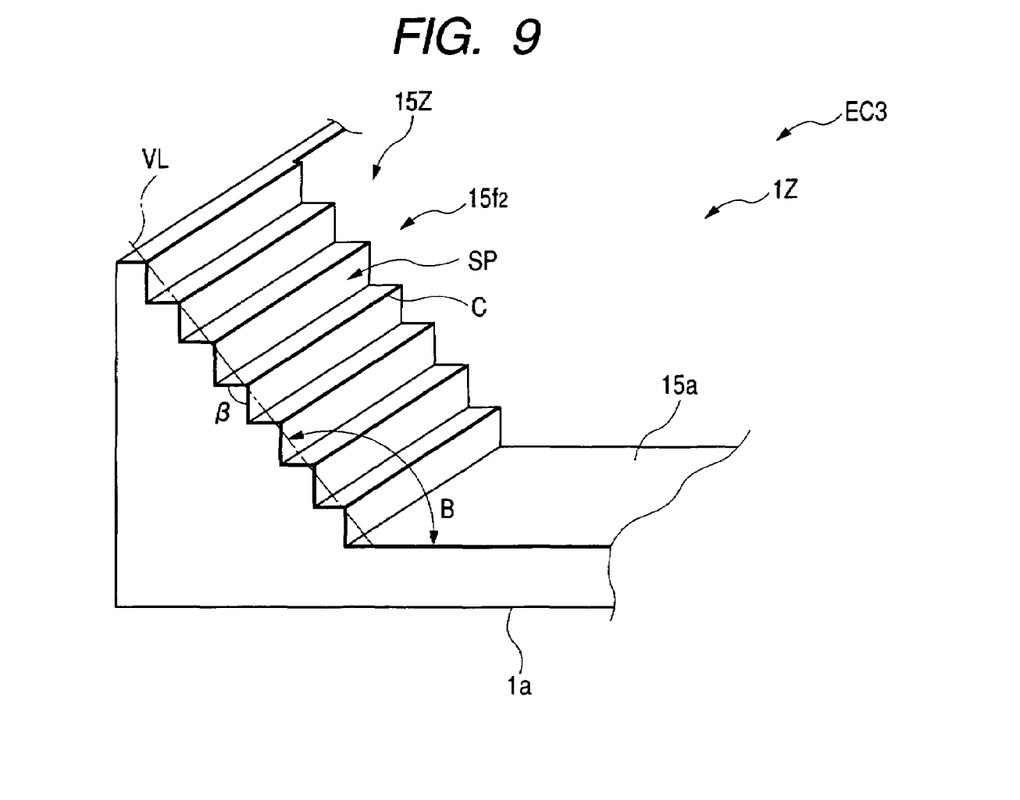
FIG. 9 is a perspective view of an electronic control unit according to a fourth embodiment of the present invention.

FIG. 9 is a perspective view of an electronic control unit EC3 according to a fourth embodiment of the present invention. In this fourth embodiment, the electronic control unit EC3 has a case 1Z whose shape is different from the case 1 according to the first embodiment.

Other elements of the electronic control unit EC3 are substantially identical with those of the electronic control unit EC according to the first embodiment so that they are assigned to the same reference characteristics of the electronic control unit EC shown in FIGS. 1–5, and explanations thereabout are omitted.

In this fourth embodiment, as well as the first embodiment, the case 1Z has the bottom wall 1a, and the side walls 1b1–1b4, and the side wall 1b4 is formed with a concave groove 15Z having a substantially inverted isosceles trapezoidal shape.

The concave groove 15Z is composed of the bottom surface 15a, and a pair of rectangular inclined surfaces 15f1 and 15f2 that are not parallel but have equal longitudinal lengths.

One longitudinal end portion of one inclined surface 15f1 is connected to one lateral side of the bottom surface 15a, and one longitudinal end portion of other inclined surface 15f2 is connected to other lateral side of the bottom surface 15a.

As shown in FIG. 9, each of the inclined surfaces 15f1 and 15f2 is formed with a set of sequentially stepped portions SP over the inclination direction (longitudinal direction) of each of the inclined surfaces 15f1 and 15f2 and inclined outwardly with respect to the bottom surface 15a.

Each of the stepped portions SP has a corner C with an angle β of approximately 90°

A virtual line VL connecting each corner C1 is inclined with respect to the lateral surface 2a at approximately the case inclined angle B.

Incidentally, in FIG. 9, the inclined surface 15f2 is only illustrated in large scale, and the illustration of inclined surface 15f1, because it is substantially identical with the illustration of inclined surface 15f2, is omitted.

In this fourth embodiment, when inserting the connector 2 into the concave groove 15Z of the case 1Z to fit it therein, the seal member 3 is pressed by the inclined surfaces 2c1 and 2c2 of the connector 2.

According to the electronic control unit EC3, however, the pressed seal member 3 is caught by the step portions SP of each of the inclined surfaces 15f1 and 15f2, which prevents the seal member 3 from being pressed into the lateral surface 15a side of the concave groove 15Z.

This makes it possible to keep the fill quantity of the seal member 3 in part of its longitudinal surface 2b side, allowing the airtightness of the electronic control unit EC3 between the connector 2 and the case 1 to be sufficiently maintained.

Incidentally, in this fourth embodiment, each corner C of each of the step portions SP has the angle of approximately 90°, but the present invention is not limited to the structure.

Figure 10:
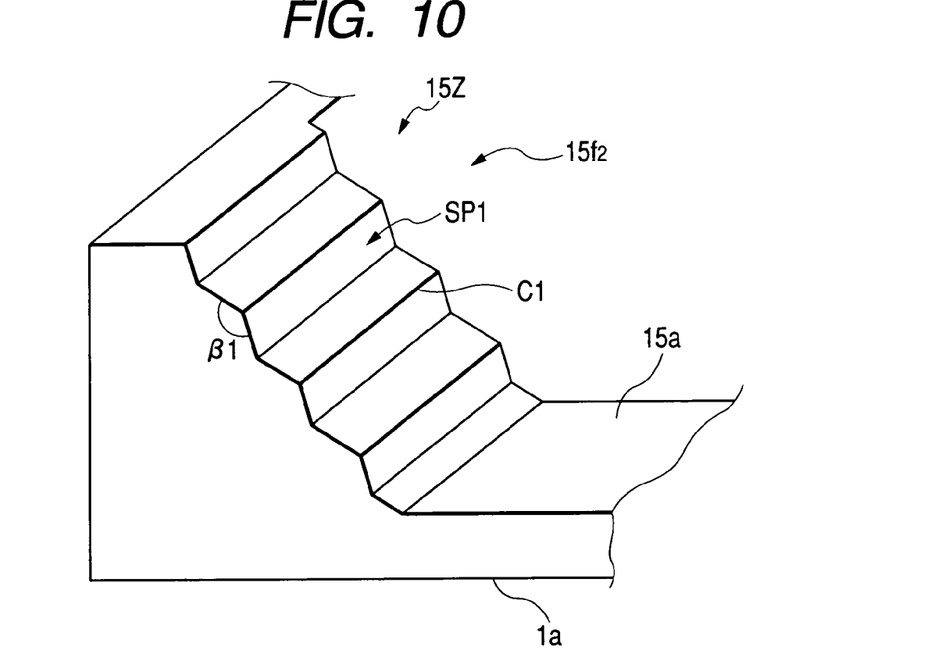
FIG. 10 is a perspective view of an electronic control unit according to a modification of the fourth embodiment of the present invention.

That is, as shown in FIG. 10, in each of the inclined surfaces 15f1 and 15f2, each corner C of the step portions SP1 may have an obtuse angle β1.

Figure 11:
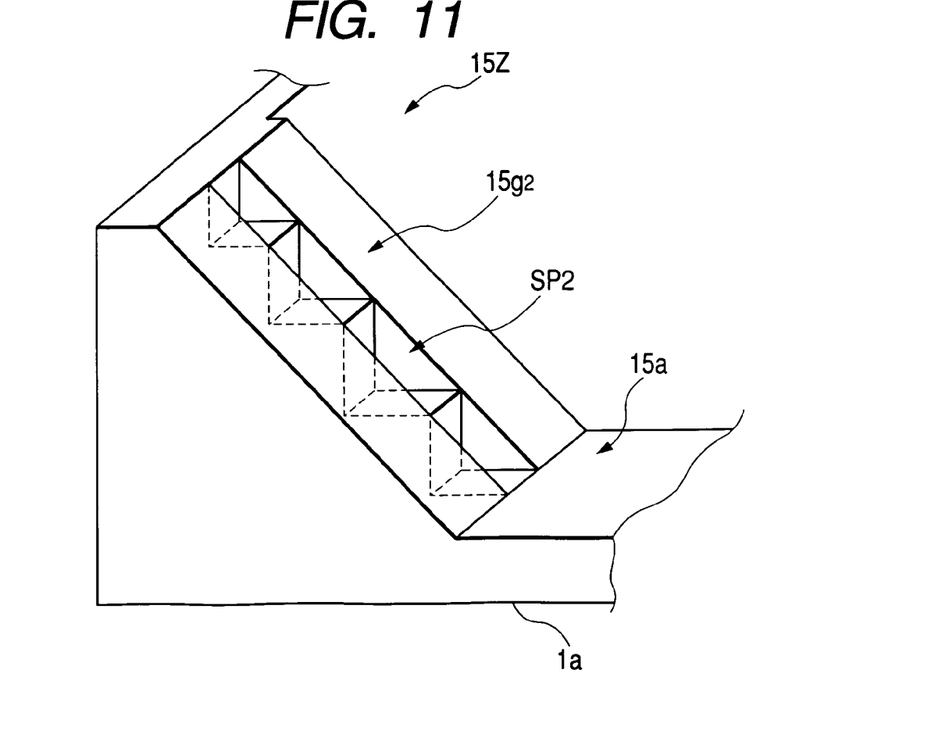
FIG. 11 is a perspective view of an electronic control unit according to another modification of the fourth embodiment of the present invention.

In addition, as shown in FIG. 11, each of inclined surfaces 15g1 and 15g2 may be formed at its longitudinal center part with a set of sequentially stepped portions SP2 and inclined outwardly with respect to the bottom surface 15a.

Furthermore, in the fourth embodiment, the step portions SP (SP1, SP2) are formed on each of the inclined surfaces of the concave groove according to the first embodiment, whose case inclined angles B are different from the connector inclined angles A of the connector 2. The present invention, however, is not limited to the application.

That is, each of the inclined side surfaces J10 and J11 of the concave groove J3 shown in FIG. 12 may be formed with the step portions SP (SP1, SP2).

According to this modification, when the connector J2 is inserted into the concave groove J3 of the case J1, the seal member J4 is pressed by the inclined side surfaces J5 and J6 of the connector J2.

This structure, however, allows the pressed seal member J4 to be caught by the step portions SP (SP1, SP2) of each of the inclined side surfaces J10 and J11, making it possible to prevent the seal member J4 from being pressed into the base surface J9 side of the concave groove J3.

Moreover, in each of the first to fourth embodiments and modifications of the present invention, the present invention is applied to each of the electronic control units used in ECUs for engines. The present invention, however, may be applied to another electronic control unit for another device.

Incidentally, in each of the first to fourth embodiments and their modifications, the case has a substantially rectangular parallelepiped shape, but the present invention is not limited to the structure. That is, the case may have a peripheral side portion, such as a tubular side wall which is formed with a concave groove in which the connector is fitted with a clearance portion therebetween.

While there has been described what is at present considered to be the embodiments and modifications of the invention, it will be understood that various modifications which are not described yet may be made therein, and it is intended to cover in the appended claims all such modifications as fall within the true spirit and scope of the invention.

This application is based upon and claims the benefit of priority of the prior Japanese Patent Application 2003-108963 filed on Apr. 14, 2003 so that the contents of which are incorporated herein by reference.

What is claimed is:

1. An electronic control unit comprising: a connector having a lateral surface, a longitudinal surface opposite to the lateral surface, and a pair of first inclined portions connecting the lateral surface and longitudinal surface, at least one of said first inclined portions being inclined with respect to the lateral surface at a first angle; a case having a peripheral side portion formed with a concave groove in which the connector is fitted with a clearance portion there between, said concave groove comprising a base surface opposite to the lateral surface of the connector; and a pair of second inclined portions opposite to the first inclined portions, respectively, at least one of said second inclined portions opposite to the at least one of said first inclined portions being inclined with respect to the base surface at a second angle, said second angle being larger than the first angle; and a seal member disposed in the clearance portion between the connector and the concave groove of the case, said seal member sealing the clearance portion there between.

2. An electronic control unit according to claim 1, wherein each of said first inclined portions is inclined outwardly with respect to the lateral surface at the first angle, and each of said second inclined portions is inclined outwardly with respect to the base surface.

3. An electronic control unit according to claim 1, wherein a difference between said first angle and said second angle is equal to 1 degree or more.

4. An electronic control unit according to claim 1, wherein said connector has a chamfered portion that is formed by chamfering a corner portion formed between at least one end of the longitudinal surface and at least one of the first inclined portions that is connected to the at least one end of the longitudinal surface.

5. An electronic control unit according to claim 4, wherein said chamfered portion extends from the at least one end of the longitudinal surface toward the at least one of the first inclined portions to be substantially orthogonal to the longitudinal surface.

6. An electric control unit according to claim 4, wherein at least one of said second inclined portions opposite to the at least one of the first inclined portions has one and other end portions, said one end portion of the at least one of second inclined portions is connected to the base surface, and said other end portion of the at least one of second inclined portions is opposite to the chamfered portion and is parallel thereto.

7. An electric control unit according to claim 1, wherein a first compressibility of a part of the seal member that is adjacent to the longitudinal surface of the connector in a surface direction thereof is equal to or less than a second compressibility of a part of the seal member that is adjacent to the lateral surface of the connector in the surface direction.

8. An electric control unit according to claim 1, wherein said connector is made of a material having a linear expansion coefficient, said clearance portion includes a clearance formed between each first inclined portion of the connector and each second inclined portion of the case and positioned parallely in adjacent to the lateral surface of the connector is represented as S1 and a clearance formed between each first inclined portion of the connector and each second inclined portion of the case and positioned parallely in adjacent to the longitudinal surface of the connector is represented as S2, a length of the lateral surface of the connector is represented as C1, a length of the longitudinal surface of the connector is represented as C2, the liner expansion coefficient of the material of the connector is represented as $\alpha$, a temperature of the connector is represented as T, wherein said parameters S1, S2, C1, C2, $\alpha$, and T are satisfied with a relationship there among defined by the following equation:

$$((\alpha T \cdot C1 - C1)/2)/S1 \geq ((\alpha T \cdot C2 - C2)/2)/S2.$$

9. An electric control unit according to claim 1, wherein said case is made of a first material having a first linear expansion coefficient, said connector is made of a second material having a second liner expansion coefficient, and said first and second linear expansion coefficients are different from each other.

10. An electric control unit according to claim 9, wherein said second linear expansion coefficient is larger than the first linear expansion coefficient.

11. An electronic control unit comprising:
   a connector having a lateral surface, a longitudinal surface opposite to the lateral surface, and a pair of first inclined portions connecting the lateral surface and longitudinal surface;
   a case having a peripheral side portion formed with a concave groove in which the connector is fitted with a clearance portion therebetween, said concave groove comprising a base surface opposite to the lateral surface of the connector; and a pair of second inclined portions opposite to the first inclined portions, respectively; and
   a seal member disposed in the clearance portion between the connector and the concave groove of the case, said seal member sealing the clearance portion therebetween,
   wherein a first clearance formed between each first inclined portion of the connector and each second inclined portion of the case and positioned parallely in adjacent to the longitudinal surface of the connector is wider than a second clearance formed between each first inclined portion of the connector and each second inclined portion of the case and positioned parallely in adjacent to the lateral surface of the connector.

12. An electric control unit according to claim 11, wherein said case is made of a first material having a first linear expansion coefficient, said connector is made of a second material having a second liner expansion coefficient, and said first and second linear expansion coefficients are different from each other.

13. An electric control unit according to claim 12, wherein said second linear expansion coefficient is larger than the first linear expansion coefficient.

14. An electronic control unit comprising:
   a connector having a lateral surface, a longitudinal surface opposite to the first surface, and a pair of first inclined portions connecting the lateral surface and longitudinal surface;
   a case having a peripheral side portion formed with a concave groove in which the connector is fitted with a clearance portion therebetween, said concave groove comprising a base surface opposite to the lateral surface of the connector; and a pair of second inclined portions opposite to the first inclined portions, respectively, at least one of said inclined portions being formed with at least partially a plurality of stepped portions over an inclination direction of the at least one of the inclined portions; and a seal member disposed in the clearance portion between the connector and the concave groove of the case, said seal member sealing the clearance portion therebetween.

15. An electric control unit according to claim 14, wherein each of said stepped portions has a corner with an angle of approximately 90 degrees and over.

16. An electric control unit according to claim 14, wherein said case is made of a first material having a first linear expansion coefficient, said connector is made of a second material having a second liner expansion coefficient, and said first and second linear expansion coefficients are different from each other.

17. An electric control unit according to claim 16, wherein said second linear expansion coefficient is larger than the first linear expansion coefficient.

* * * * *

UNITED STATES PATENT AND TRADEMARK OFFICE
CERTIFICATE OF CORRECTION

PATENT NO.         : 7,227,757 B2                                                                 Page 1 of 1
APPLICATION NO. : 10/823593
DATED              : June 5, 2007
INVENTOR(S)        : Mizutani It is certified that error appears in the above-identified patent and that said Letters Patent is hereby corrected as shown below:

Col. 12, line 57, Thur Col. 14, line 10, cancel claims 14-17.

Signed and Sealed this

Thirteenth Day of November, 2007

JON W. DUDAS
*Director of the United States Patent and Trademark Office*